United States Patent
Bean

(10) Patent No.: US 6,215,275 B1
(45) Date of Patent: Apr. 10, 2001

(54) METHOD FOR THE AUTOMATIC DETERMINATION OF BATTERY CHEMISTRY IN PORTABLE ELECTRONIC DEVICES

(75) Inventor: Heather N. Bean, Fort Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/430,334

(22) Filed: Oct. 29, 1999

(51) Int. Cl.$^7$ ............................ H02J 7/00; G01N 27/416
(52) U.S. Cl. ..................... 320/106; 320/162; 324/429; 324/433; 340/636
(58) Field of Search ........................... 320/106, 162, 320/134, 136, 107; 324/429, 433; 340/636

(56) References Cited

U.S. PATENT DOCUMENTS

| | | | |
|---|---|---|---|
| 5,237,257 | * 8/1993 | Johnson et al. | 320/106 |
| 5,739,596 | * 4/1998 | Takizawa et al. | 307/66 |
| 6,014,008 | * 1/2000 | Hartzell et al. | 320/106 |
| 6,037,778 | * 3/2000 | Makhija | 324/433 |
| 6,114,831 | * 9/2000 | Attimont et al. | 320/106 |

* cited by examiner

Primary Examiner—Peter S. Wong
Assistant Examiner—Gregory J. Toatley, Jr.
(74) Attorney, Agent, or Firm—Patrick J. Murphy

(57) ABSTRACT

A method that distinguishes different battery chemistries in portable electronic devices using a simple electrical test. The present method facilitates accurate fuel gauging as well as providing a safe in-device recharging scenario, eliminating the possibility that an end-user might attempt recharging a non-rechargeable battery. A simple circuit is provided in the electronic device that, in conjunction with a microcontroller, measures several distinct voltages across a newly inserted battery. A lookup table is then utilized to determine the probable battery chemistry.

3 Claims, 4 Drawing Sheets

METHOD FOR THE AUTOMATIC DETERMINATION OF BATTERY CHEMISTRY IN PORTABLE ELECTRONIC DEVICES

FIELD OF THE INVENTION

The present invention relates generally to batteries and more particularly to a method that distinguishes different battery chemistries using a simple electrical test.

BACKGROUND OF THE INVENTION

A battery is a device that converts chemical energy into electricity. A well-known example of a primary cell is standard alkaline battery. The electrolyte is an alkaline gel, usually potassium hydroxide. The positive electrode is made of magnesium dioxide; the negative electrode is made of zinc. Well-known rechargeable batteries are nickel-cadmium, nickel-metal hydride, or lithium ion batteries. Secondary batteries self-discharge more rapidly than primary batteries and must be recharged before they are used.

Manufacturers of battery-powered, portable consumer electronics typically must select one form factor, or type of battery to use-typically either AA-sized batteries or a rechargeable pack. Most portable electronic devices that can accept AA-sized batteries can accept a variety of battery chemistries, both rechargeable and non-rechargeable. The five types of batteries available to consumers in the AA form factor are alkaline; high-drain alkaline; high-energy lithium; nickel-metal hydride; and nickel cadmium. These different battery chemistries do not behave the same way during discharge. This difference in discharge poses a problem for fuel gauging. Additionally, if one wishes to recharge the batteries in the device, the batteries need to be identified as rechargeable so that non-rechargeable batteries are not subject to accidental charging.

Conventional portable electronic devices use one of two charge monitoring techniques:
- use only an application specific battery pack, calibrating the fuel gauges and charging accordingly; or
- use standard AA batteries, calibrate the fuel gauge for a predetermined chemistry (e.g., alkaline) and only allow charging outside the device.

These conventional approaches have obvious disadvantages. In the first technique, the user is restricted to using very specific, often expensive batteries and the device may be unusable while the batteries are charged. The second technique suffers the disadvantage of fuel gauging being inaccurate for any battery chemistry other the predetermined chemistry.

Typically, battery fuel gauging in portable electronic devices has been restricted to one of two methods: (1) monitoring change in voltage over change in time (dv/dt) and (2) monitoring power exiting and entering the batteries. The first method, dv/dt, is only accurate with alkaline batteries since they have a predictable sloping discharge voltage profile. Most non-alkaline batteries have a much flatter voltage discharge profile such that it is difficult to see any significant change in voltage until the voltage is almost completely discharged. Thus, if the device is configured to gauge battery fuel using the first method, dv/dt, the voltage will read close to 100% until the batteries are approximately 90% discharged.

The second method is generally used for non-alkaline batteries, i.e., batteries with a relatively flat voltage discharge profile. A limitation of this method is that it requires prior knowledge of how much approximate power can be drained from the battery before it is fully discharged. Thus, this method is typically used in situations where a known battery chemistry will be used repeatedly. If the device could determine chemistry, then this method of monitoring power exiting and entering the battery could be used more readily.

Since alkaline batteries are by far the most common battery type, most portable electronic devices use fuel gages that monitor dv/dt. With the proliferation of alternative battery chemistries and the attendant reduction in cost, consumers have greater latitude is selecting their batteries. These dv/dt fuel gauges will fail should the consumer insert a high-energy lithium or nickel-metal hydride cell in the device, for example, showing an inaccurate level of fuel available.

There is a need in the industry to ensure consumers of portable electronic devices can rely on the battery fuel gauges that are provided with the device. Additionally, there is a need to provide safe in-device battery recharging in devices that accept both rechargeable and non-rechargeable batteries.

SUMMARY OF THE INVENTION

The present invention provides a method that distinguishes different battery chemistries in portable electronic devices using a simple electrical test. The present invention facilitates accurate fuel gauging as well as providing a safe in-device recharging scenario, eliminating the possibility that an end-user might attempt recharging a non-rechargeable battery.

A simple circuit is provided in the electronic device that, in conjunction with a microcontroller, measures several distinct voltages across a newly inserted battery. A lookup table is then utilized to determine the probable battery chemistry. The preferred method comprises the steps of: (1) determining whether the battery compartment has been opened and a new battery inserted, (2) measuring the voltage of the unknown battery in its "open" state, (3) connecting the battery across a first resistor and measuring the voltage drop, (4) connecting the battery across a second resistor and measuring the voltage drop, and then (5) using the measured voltages in connection with a lookup table to determine the battery chemistry.

DETAILED DESCRIPTION OF THE PREFERRED EMBODIMENT

Briefly, the present invention provides an apparatus and method for determining battery chemistry in portable electronic devices. The claimed invention provides a simple electrical test that measures voltage outputs from an unknown battery and then, using a lookup table, makes a probable determination of the battery chemistry. The preferred method comprises the steps of: (1) connecting the battery across a first resistor and measuring the voltage drop, (2) connecting the battery across a second smaller resistor and measuring the voltage as a minimum voltage, and then (3) using the measured voltages in connection with a lookup table to determine the battery chemistry.

The minimum voltage encountered during nearly short-circuit drain is representative of the cell's diffusion-limited reaction rate while the voltage drop encountered during a moderately high drain is generally representative of the cell's kinetically-limited rate. This dimensionless number, Vr/Vmin is unique for several categories of common AA form factor chemistries. This uniqueness facilitates the classification of up to five different battery chemistries: nickel-cadmium, nickel-metal hydride, high-drain alkaline, standard alkaline, and high-energy lithium. Since Vr/Vmin presents itself as a range for each battery chemistry, there is necessarily a small overlap near the edges of some of these ranges. For example, high-drain alkaline batteries may occasionally fall into the lower end of the high-lithium range while nickel-metal hydride batteries that are partially discharged may fall into the nickel-cadmium range. This, however, does not pose a serious drawback since there exists excellent separation between rechargeable and non-rechargeable battery chemistries.

Analyzing this dimensionless number has achieved an identification accuracy rate of greater than 80% for all types of battery chemistries in various states of discharge, and 100% accuracy in distinguishing rechargeable batteries from non-rechargeable batteries.

Figure 1:
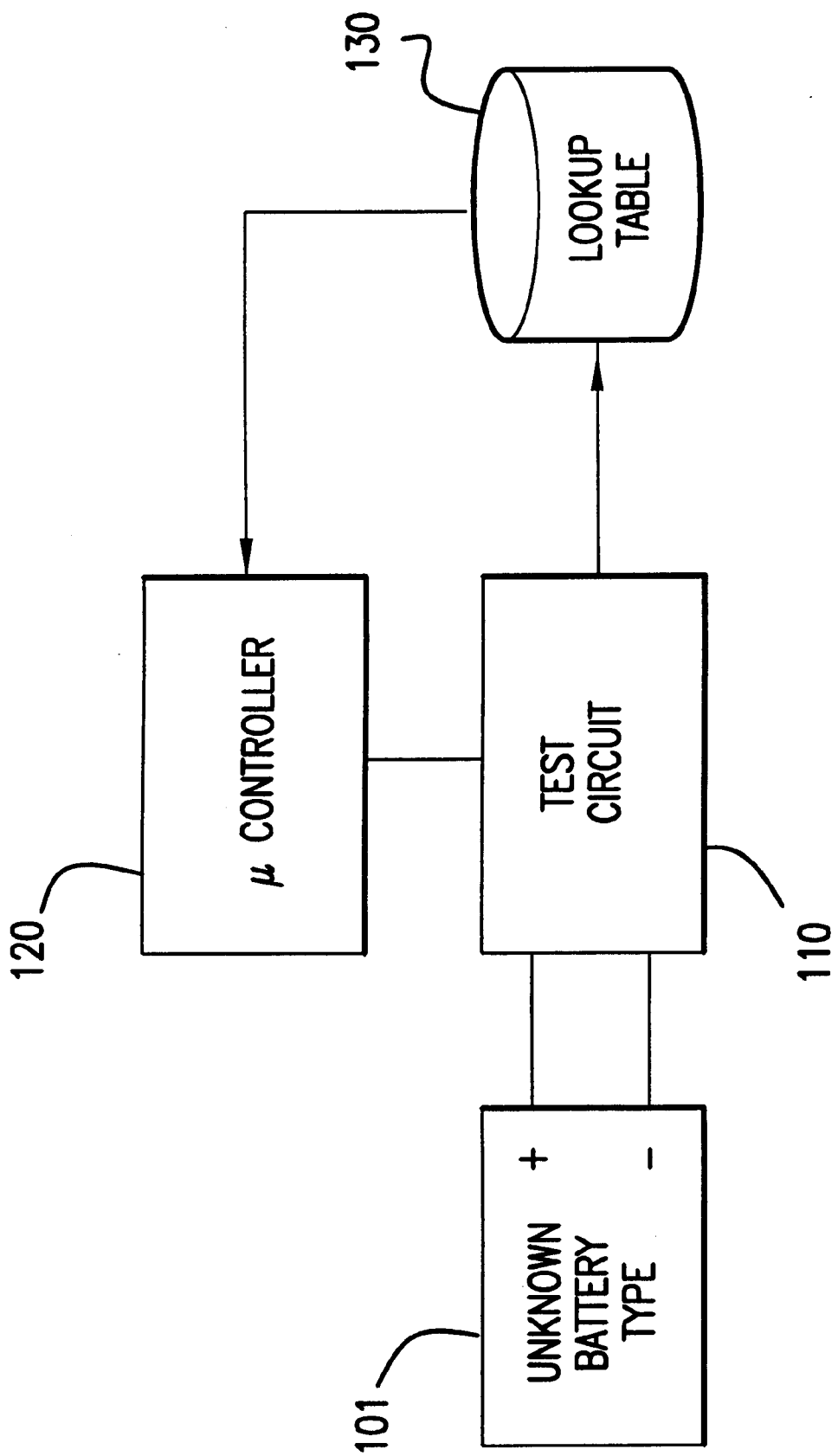
FIG. 1 shows a simple block diagram of the test circuit used to determine battery chemistry according to the present invention.

The claimed apparatus will now be described with reference to FIGS. 1 and 2. FIG. 1 shows a block diagram in which unknown battery type 101 is disposed in a portable electronic device and is electrically connected to a test circuit 110. Test circuit is controlled by microcontroller 120 which in a preferred embodiment can be simply the device microprocessor (not shown) configured to run the present test or a separate controller designed specifically for the purpose of determining battery chemistry. A lookup table can be constructed by measuring several batteries under uniform testing conditions, collecting information of each battery type's voltage responses to predetermined conditions.

Figure 2:
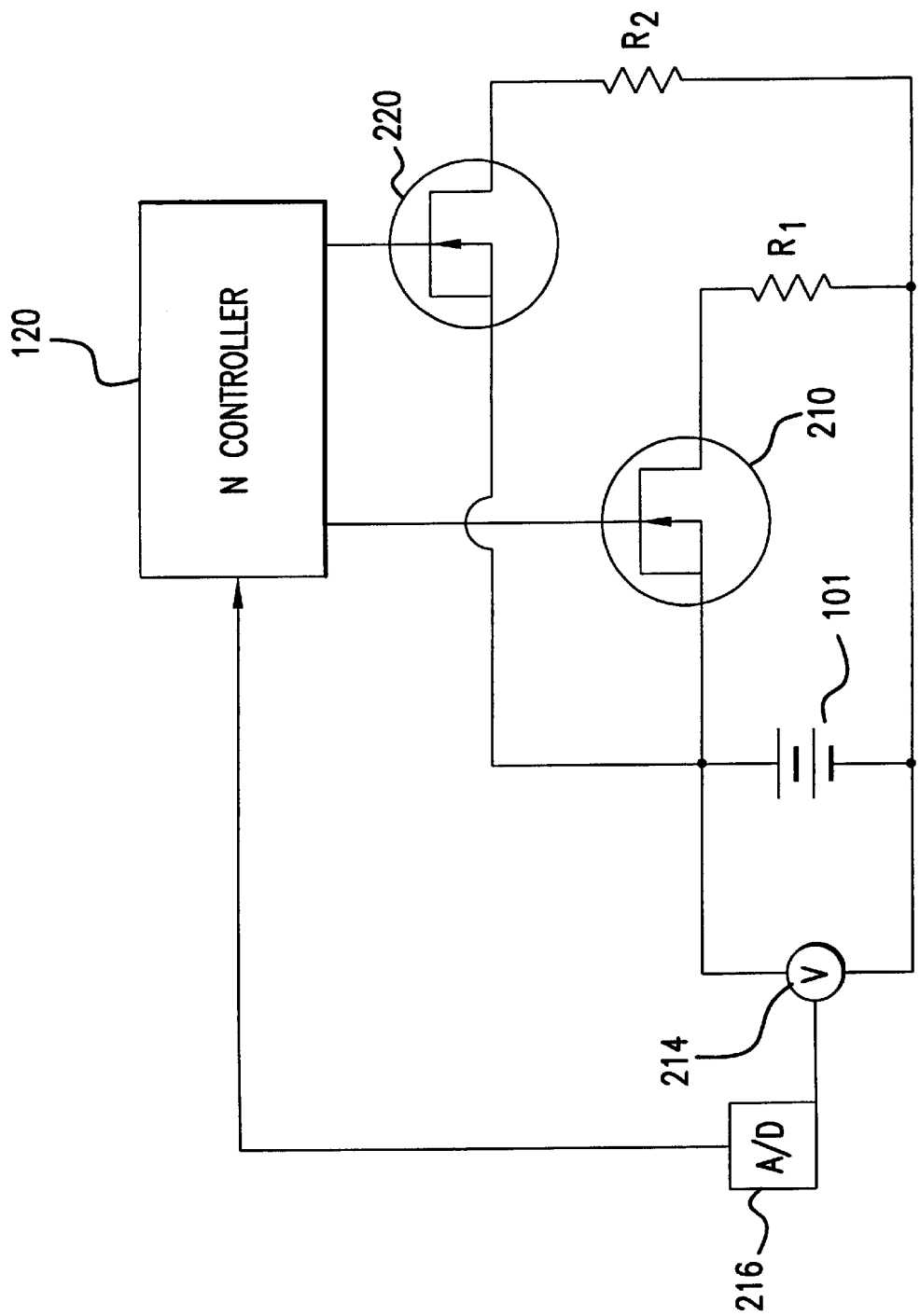
FIG. 2 shows a first embodiment of the present circuit diagram.

FIG. 2 shows a simple circuit for measuring the various voltages needed to identify the chemistry of the unknown battery type 101. A voltmeter 214 is connected across battery 101. The voltmeter 214 is controlled by microcontroller 120 through an A/D converter 216. A power MOSFET 210 controlled by the microcontroller has a characteristic resistance, $R_0$, that is very small in comparison to a resistor, $R_1$, which is connected across battery 101. A second resistor, $R_2$, is also connected across battery 101 and controlled by a second power MOSFET 220. In a preferred embodiment, $R_1$ is approximately 0.2 ohms while $R_2$ is approximately 3 ohms. Operation of the circuit will be described in connection with FIG. 3 that shows a flow diagram of the present method.

Figure 3:
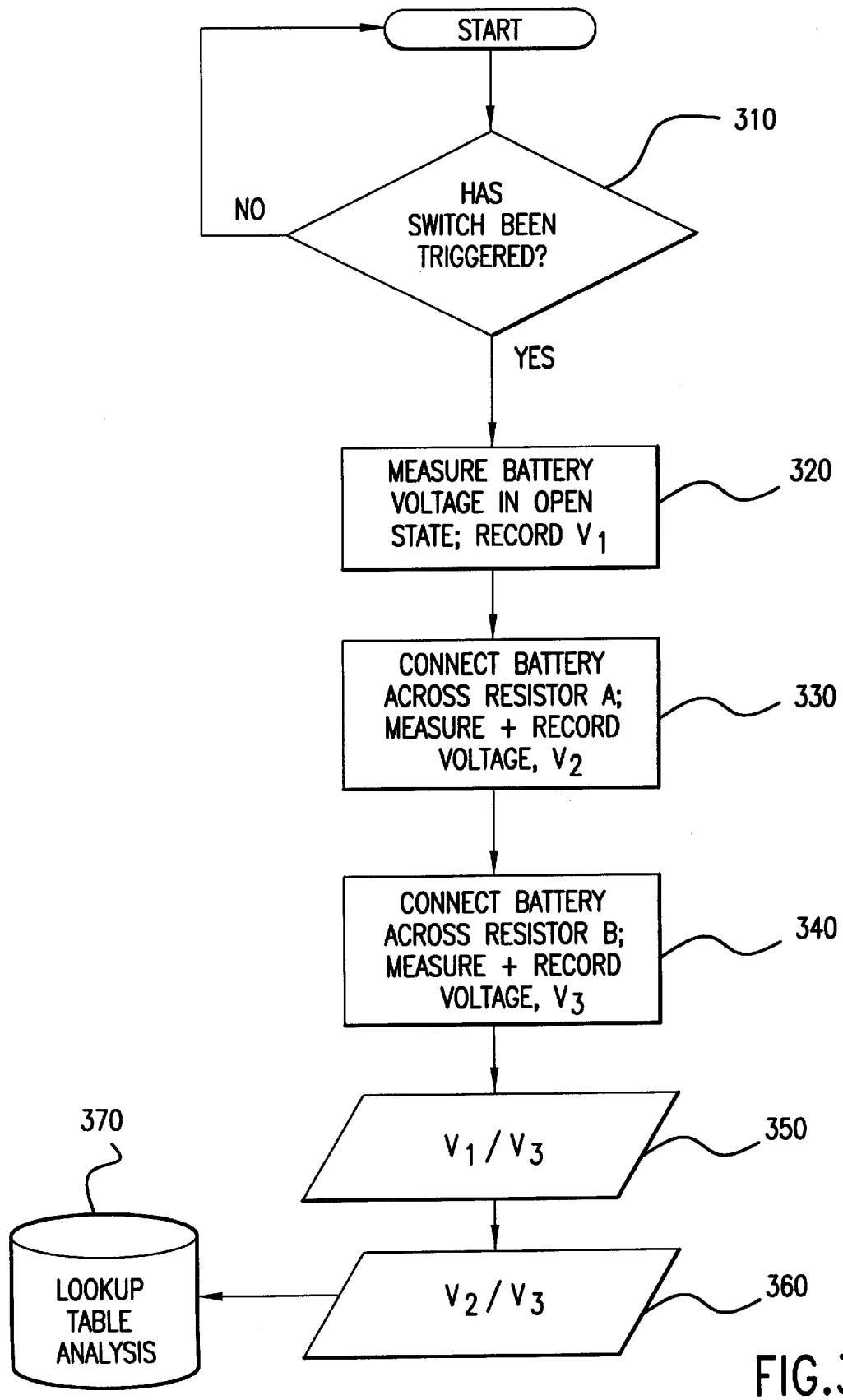
FIG. 3 shows a flow diagram of the present method for determining battery chemistry in portable electronic devices.

FIG. 3 starts with decisional block 310 which determines whether the battery compartment door switch on the portable electronic device was triggered indicative of the door being opened and closed. At block 330, the battery 101 is connected across resistor A (i.e., in FIG. 2) and the resultant voltage is measured and recorded as $V_1$. In a preferred embodiment, resistor A is approximately 3 ohms. At block 340, the minimum voltage (i.e., voltage encountered during a very high drain that is representative of the cell's maximum reaction rate) is determined. In this instance, the battery 101 is connected across switch 210 with a characteristic resistance of approximately 0.2 ohms. The voltage is measured and recorded as $V_2$. At block 350 the dimensionless number (described above) is calculated. With this number, a lookup table like the one below is used to determine the most probable battery type.

| Battery Type | Vr/Vmin range |
| --- | --- |
| Nickel Cadmium | 2.2–2.6 |
| Nickel Metal Hydride | 2.5–2.8 |
| High Drain Alkaline | 3.5–4.7 |
| High Energy Lithium | 4.6–5.6 |
| Alkaline | 8.0–8.5 |

If it is determined that the chemistry present in the device is non-rechargeable, the microcontroller then disables any on-board battery charging circuits that the device may have. Once chemistry is accurately determined, it is possible to use energy monitoring to determine the approximate percent charge remaining when referenced to a usual total energy capacity for that battery chemistry. The usual energy capacity value for each chemistry is stored in memory where the microcontroller can access it. In addition to maintaining a list of general usual energy capacities for each battery chemistry, it is possible to maintain a database in memory of the latest measured energy capacities of each battery chemistry. When these are extant and within a tolerance around the expected energy capacity, the actual measured numbers can be used, allowing the fuel gauging system to adapt to the specific batteries that the user prefers for greater accuracy.

Figure 4:
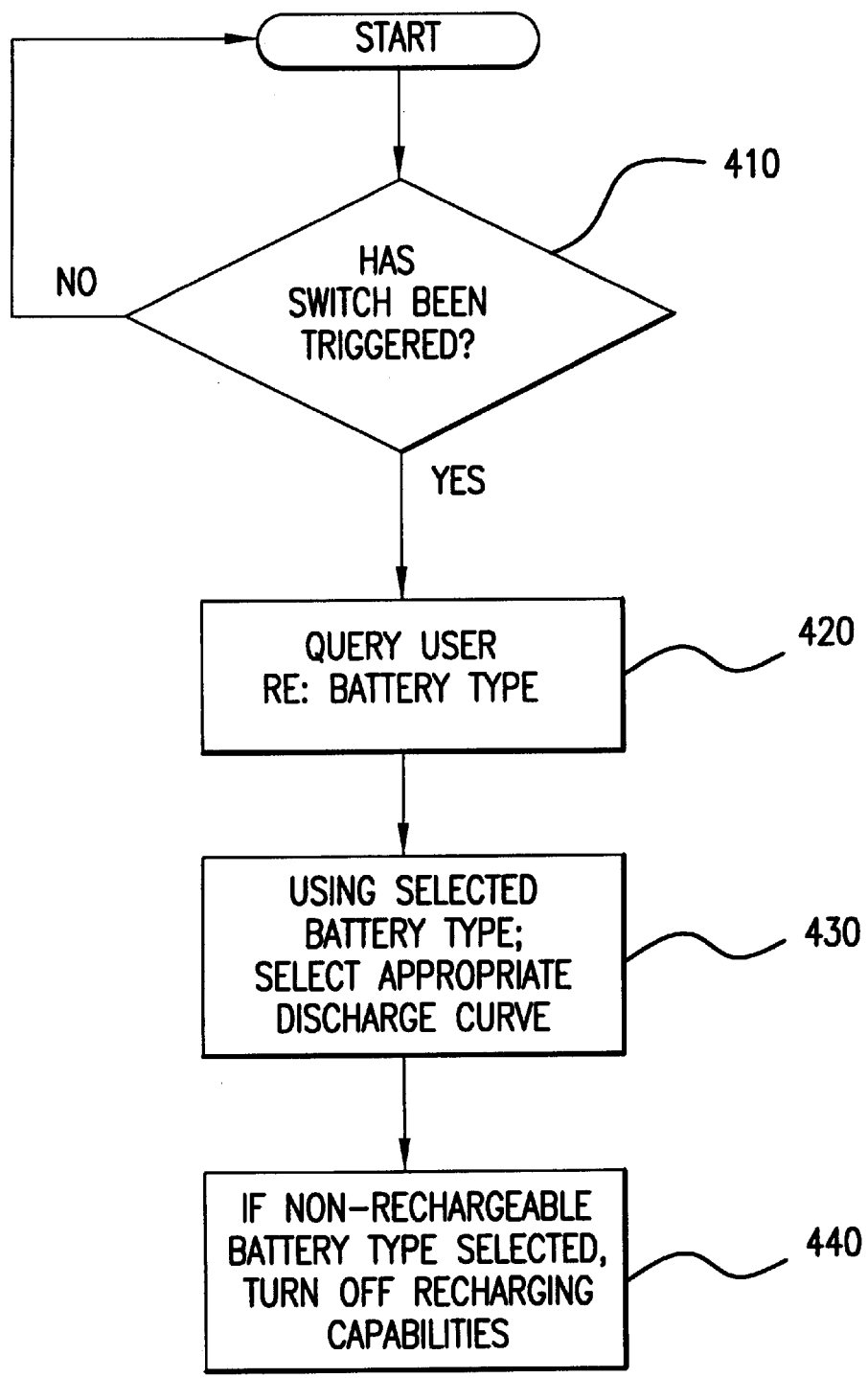
FIG. 4 shows a flow diagram of a method for ensuring proper fuel gauging of battery discharge.

FIG. 4 shows an alternative method for ensuring accurate fuel gauging and safe in-device recharging when using multiple battery chemistries in a portable electronic device. Decisional block 410 determines whether the battery compartment door switch on the portable electronic device was triggered indicative of the door being opened and closed. If yes, block 420 queries the user as to the type of battery was inserted. A representative dialog box is shown in Table 1.

TABLE 1

Representative User Menu

New Batteries Inserted.
Please select a battery type from the following menu:
Alkaline
High-Energy Lithium
Nickel Metal Hydride
Nickel Cadmium
Other/Not Sure (note: No In-Device Recharge Available!)

Block 430 takes the user input and selects the appropriate battery chemistry energy capacity for use in conjunction with the fuel gauge. If the selected battery type is non-rechargeable, then block 440 turns off the recharging capability of the device. Once chemistry is accurately determined, it is possible to use energy monitoring to determine the approximate percent charge remaining when referenced to a usual total energy capacity for that battery chemistry. The usual energy capacity value for each chemistry is stored in memory where the microcontroller can access it. In addition to maintaining a list of general usual energy capacities for each battery chemistry, it is possible to maintain a database in memory of the latest measured energy capacities of each battery chemistry. When these are extant and within a tolerance around the expected energy capacity, the actual measured numbers can be used, allowing the fuel gauging system to adapt to the specific batteries that the user prefers for greater accuracy.

While the present invention has been illustrated and described in connection with the preferred embodiment, it is not to be limited to the particular structure shown. It should be understood by those skilled in the art that various changes and modifications may be made within the purview of the appended claims without departing from the spirit and scope of the invention in its broader aspects.

What is claimed is:

1. A method for distinguishing different battery chemistries in a portable electronic device, the device having a battery compartment, the method comprising the steps of:

(1) determining whether the battery compartment has been opened;

(2) connecting the battery across a first resistor and measuring a first voltage drop;

(3) connecting the battery across a second resistor and measuring a second voltage drop; and (4) dividing the first voltage drop the second voltage drop to obtain a resultant;

(5) using the resultant in connection with a lookup table to determine the battery chemistry.

2. The method of claim 1 further comprising the step of:

(6) if the battery chemistry determined in step (5) is indicative of a non-rechargeable battery chemistry, disabling any on-board battery charging circuits.

3. The method of claim 2 further comprising the step of:

(7) if the battery chemistry determined in step (5) is indicative of a rechargeable battery chemistry, providing a fuel gauge indicative of the charge remaining in the battery.

* * * * *